United States Patent
Ogawa et al.

(10) Patent No.: US 9,651,807 B2
(45) Date of Patent: May 16, 2017

(54) METHOD OF PRODUCING IMAGE DISPLAY DEVICE AND RESIN DISPENSER

(71) Applicant: DEXERIALS CORPORATION, Tokyo (JP)

(72) Inventors: Kouichi Ogawa, Utsunomiya (JP); Akihiko Watanabe, Utsunomiya (JP); Akira Konno, Utsunomiya (JP); Takashi Endo, Sano (JP); Masayuki Tani, Miyagi-gun (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/443,515

(22) PCT Filed: Dec. 16, 2013

(86) PCT No.: PCT/JP2013/083564
§ 371 (c)(1),
(2) Date: May 18, 2015

(87) PCT Pub. No.: WO2014/092199
PCT Pub. Date: Jun. 19, 2014

(65) Prior Publication Data
US 2015/0293397 A1    Oct. 15, 2015

(30) Foreign Application Priority Data
Dec. 14, 2012 (JP) ................. 2012-273945

(51) Int. Cl.
*G02F 1/1333* (2006.01)
*H01J 11/44* (2012.01)
(Continued)

(52) U.S. Cl.
CPC .... *G02F 1/133308* (2013.01); *B32B 37/0046* (2013.01); *B32B 37/1284* (2013.01);
(Continued)

(58) Field of Classification Search
CPC ............. H01L 51/5246; H01L 21/6715; H01L 51/5284; B05C 5/0254; G02F 1/133308;
(Continued)

(56) References Cited

U.S. PATENT DOCUMENTS

| | | | |
|---|---|---|---|
| 2010/0277684 A1 | 11/2010 | Fukushima et al. | |
| 2011/0155318 A1* | 6/2011 | Shibata | G02F 1/1303 156/275.5 |
| 2013/0029075 A1* | 1/2013 | Niiyama | G02F 1/133308 428/41.7 |

FOREIGN PATENT DOCUMENTS

| | | |
|---|---|---|
| JP | H02187096 A | 7/1990 |
| JP | H10277464 A | 10/1998 |

(Continued)

OTHER PUBLICATIONS

Sep. 27, 2016 Notification of Reason(s) for Refusal issued in Japanese Patent Application No. 2013-258803.
(Continued)

*Primary Examiner* — Jacob T Minskey
*Assistant Examiner* — Vishal I Patel
(74) *Attorney, Agent, or Firm* — Oliff PLC

(57) ABSTRACT

Method of producing an image display device in which an image display member and light-transmitting cover member having principal surface portion and circumferential edge portion on which a light-shielding layer is formed with a step portion formed between the principal surface portion and the circumferential edge portion are laminated through light-transmitting resin layer formed from a liquid optical resin composition so a light-shielding layer formed surface of the light-transmitting cover member is arranged to face the image display member, when a resin dispenser is moved from one end of the light-shielding layer formed surface of the light-transmitting cover member toward the other end applying the liquid optical resin composition to the light- (Continued)

shielding layer formed surface of the light-transmitting cover member, the application amount of optical resin composition is changed on the principal surface portion of the light-shielding layer formed surface of the light-transmitting cover member and on the light-shielding layer.

13 Claims, 10 Drawing Sheets

(51) Int. Cl.
*B32B 37/12* (2006.01)
*G02F 1/13* (2006.01)
*H01L 21/67* (2006.01)
*B32B 37/00* (2006.01)
*H01L 51/52* (2006.01)
*G02F 1/1335* (2006.01)
*B05C 5/02* (2006.01)
*B32B 38/00* (2006.01)

(52) U.S. Cl.
CPC ............ *G02F 1/1303* (2013.01); *H01J 11/44* (2013.01); *H01L 21/6715* (2013.01); *B05C 5/0254* (2013.01); *B32B 2037/1253* (2013.01); *B32B 2038/0076* (2013.01); *B32B 2457/20* (2013.01); *G02F 1/133512* (2013.01); *G02F 2001/13332* (2013.01); *G02F 2001/133331* (2013.01); *G02F 2202/28* (2013.01); *H01L 51/5246* (2013.01); *H01L 51/5284* (2013.01)

(58) Field of Classification Search
CPC ....... G02F 2001/13332; G02F 2202/28; G02F 1/1303; G02F 1/133512; G02F 2001/133331; B32B 37/1284; B32B 2457/20; B32B 37/0046; B32B 2037/1253; B32B 2038/0076; H01J 11/44
See application file for complete search history.

(56) References Cited

FOREIGN PATENT DOCUMENTS

| | | |
|---|---|---|
| JP | H11290744 A | 10/1999 |
| JP | 2001137764 A | 5/2001 |
| JP | 2002296600 A | 10/2002 |
| JP | 2009073078 A | 4/2009 |
| JP | 2009-186959 A | 8/2009 |
| JP | 2009186956 A | 8/2009 |
| JP | 2009186960 A | 8/2009 |
| JP | 2010012469 A | 1/2010 |
| JP | 2010175919 A | 8/2010 |
| JP | 2011150331 A | 8/2011 |
| JP | 2012071281 A | 4/2012 |
| WO | 2006118088 A1 | 11/2006 |
| WO | 2009054168 A1 | 4/2009 |
| WO | 2010027041 A1 | 3/2010 |

OTHER PUBLICATIONS

Jul. 8, 2016 Extended European Search Report issued in Application No. 13862114.9.
Mar. 18, 2014 International Search Report issued in International Application No. PCT/JP2013/083564.
"Method of Measuring Physical Properties of Adhesive Material," http://www.rhesca.co.jp/main/technical/technical.html.
Jul. 9, 2015 International Preliminary Report on Patentability issued in Internatnional Patent Application No. PCT/JP2013/083564.

* cited by examiner

METHOD OF PRODUCING IMAGE DISPLAY DEVICE AND RESIN DISPENSER

TECHNICAL FIELD

The present invention relates to a method of producing an image display device by bonding and laminating an image display member such as a liquid crystal display panel to a light-transmitting cover member such as a transparent protective sheet disposed on the front side of the image display member through a light-transmitting cured resin layer.

BACKGROUND ART

An image display device such as a liquid crystal display panel used for an information terminal such as a smartphone is produced by: placing a photocurable resin composition between an image display member such as a liquid crystal display panel or an organic EL panel and a light-transmitting cover member; and then irradiating the composition with ultraviolet rays to cure the composition to thereby form a light-transmitting cured resin layer, whereby the image display member and the light-transmitting cover member are bonded and laminated to each other (Patent Literature 1).

Specifically, as shown in FIG. 14(A), a light-transmitting cover member 20 is first prepared, and a liquid photocurable resin composition 21 is applied to a surface 20a of the light-transmitting cover member 20 that is to face an image display device.

Next, as shown in FIG. 14(B), the photocurable resin composition 21 applied to the surface 20a of the light-transmitting cover member 20 is irradiated with ultraviolet rays to pre-cure the resin composition to thereby form a pre-cured resin layer 21' (FIG. 14(C)). The pre-curing is performed in order to render the liquid photocurable resin composition 21 less flowable so that the resin composition is prevented from running down when the cover member is turned upside down as shown in FIG. 14(C) to thereby improve handleability.

Next, as shown in FIG. 14(D), the light-transmitting cover member 20 is laminated to an image display member 23 with the pre-cured resin layer 21' facing the image display member 23.

Next, as shown in FIG. 14(E), the pre-cured resin layer 21' held between the image display member 23 and the light-transmitting cover member 20 is irradiated with ultraviolet rays to post-cure the pre-cured resin layer 21'. An image display device 25 including the image display member 23 and the light-transmitting cover member 20 that are connected through the light-transmitting cured resin layer 22 is thereby obtained (FIG. 14(F)).

CITATION LIST

Patent Literature

Patent Literature 1: WO2010/027041

SUMMARY OF INVENTION

Technical Problem

When the photocurable resin composition 21 is applied to the light-transmitting cover member 20, the photocurable resin composition 21 applied must evenly cover over the entire surface 20a of the light-transmitting cover member 20. This is because, when the photocurable resin composition 21 is not evenly applied, air bubbles are caught when the light-transmitting cover member 20 is later laminated to the image display member 23, and image distortion occurs after the lamination.

Generally, a light-shielding layer 24 is disposed on a circumferential edge portion of the surface 20a on the image display side of the light-transmitting cover member 20, in order to improve the brightness and contrast of a displayed image. Therefore, the light-transmitting cover member 20 has a step portion 26 formed between the circumferential edge portion and principal surface portion of the surface 20a by the light-shielding layer 24.

Therefore, when the photocurable resin composition 21 is applied to the surface 20a of the light-transmitting cover member 20, protrusions 27a and 27b are formed on edges of the light-transmitting cover member 20 and circumferential edges of the step portion 26 as shown in FIG. 15, so that the photocurable resin composition 21 cannot be applied evenly. This is due to the light-shielding layer 24, and protrusions are formed even when the photocurable resin composition 21 is applied to a thickness larger than the height of the step portion 26.

The protrusions 27a formed on the edges of the light-transmitting cover member 20 have no small influence on image distortion, and the protrusions 27b formed near the step portion 26 may cause image distortion because the protrusions 27b are reflected in an image region after the light-transmitting cover member 20 is laminated to the image display member. When the width of the light-shielding layer 24 is small, the protrusions 27a formed on the edges of the light-transmitting cover member 20 also influence image distortion.

Accordingly, it is an object of the present invention to provide an image display device production method in which, even when a resin composition is applied to the surface of a light-transmitting cover member having a step portion formed thereon, the resin composition can be applied evenly without protruding from the principal surface portion at the circumferential edges of the step portion. It is another object to provide a resin dispenser suitable for the image display device production method.

Solution to Problem

To solve the above problems, a method of producing an image display device according to the present invention is a method of producing an image display device in which an image display member and a light-transmitting cover member having a principal surface portion and a circumferential edge portion on which a light-shielding layer is formed with a step portion formed between the principal surface portion and the circumferential edge portion are laminated through a light-transmitting resin layer formed from a liquid optical resin composition so that a light-shielding layer-formed surface of the light-transmitting cover member is arranged to face the image display member. The method of producing the image display device includes: moving a resin dispenser from one end of the light-shielding layer-formed surface of the light-transmitting cover member toward the other end thereof to apply the liquid optical resin composition to the light-shielding layer-formed surface of the light-transmitting cover member; laminating the light-shielding layer-formed surface of the light-transmitting cover member to the image display member; and curing the optical resin composition held between the image display member and the light-transmitting cover member, wherein the resin dispenser changes the amount of the optical resin composition applied on the light-shielding layer and on the principal surface portion of the light-shielding layer-formed surface of the light-transmitting cover member.

Furthermore, a resin dispenser according to the present invention is a resin dispenser for applying an optical resin composition to a light-shielding layer-formed surface of a light-transmitting cover member having a principal surface portion and a circumferential edge portion on which a light-shielding layer is formed with a step portion formed between the principal surface portion and the circumferential edge portion (the optical resin composition being held between the light-transmitting cover member and an image display member). The resin dispenser includes: a discharge port having a width larger than the width of the principal surface portion of the light-transmitting cover member, for discharging the optical resin composition across both the light-shielding layer and the principal surface portion, the width between opposite end portions of the discharge port that face the light-shielding layer of the light-transmitting cover member being made larger than the width of a central portion of the discharge port that faces the principal surface portion, wherein the resin dispenser discharges the optical resin composition from the discharge port while moving over the light-shielding layer-formed surface of the light-transmitting cover member in a lengthwise direction thereof.

Still further, a method of producing an image display device according to the present invention is a method of producing an image display device in which an image display member and a light-transmitting cover member having a principal surface portion and a circumferential edge portion on which a light-shielding layer is formed with a step portion formed between the principal surface portion and the circumferential edge portion are laminated through a light-transmitting resin layer formed from a liquid optical resin composition so that a light-shielding layer-formed surface of the light-transmitting cover member is arranged to face the image display member. The method of producing the image display device includes the steps of: moving a resin dispenser from one end of the light-shielding layer-formed surface of the light-transmitting cover member toward the other end thereof to apply the liquid optical resin composition to the light-shielding layer-formed surface of the light-transmitting cover member; laminating the light-shielding layer-formed surface of the light-transmitting cover member to the image display member; and curing the optical resin composition held between the image display member and the light-transmitting cover member, wherein the resin dispenser has a discharge port having a width larger than the width of the principal surface portion of the light-transmitting cover member, for discharging the optical resin composition across both the light-shielding layer and the principal surface portion, the width between opposite end portions of the discharge port that face the light-shielding layer of the light-transmitting cover member being made larger than the width of a central portion of the discharge port that faces the principal surface portion, and wherein the resin dispenser discharges the optical resin composition from the discharge port while moving over the light-shielding layer-formed surface of the light-transmitting cover member in a lengthwise direction thereof.

Advantageous Effects of Invention

According to the present invention, the resin dispenser changes the amount of the optical resin composition applied on the light-shielding layer and on the principal surface portion of the light-shielding layer-formed surface of the light-transmitting cover member. In this manner, the resin dispenser 10 can apply the optical resin composition to the same height on the light-shielding layer 3 and on the principal surface portion 4, so that an even coated surface can be formed over the light-transmitting cover member 6 in its lengthwise direction. For example, when high protrusions are formed, the speed of moving on the light-shielding layer is set to be higher than that on the principal surface portion. The amount of the optical resin composition applied to the light-shielding layer thereby becomes smaller than that to the principal surface portion, so that the optical resin composition can be applied evenly.

DESCRIPTION OF EMBODIMENTS

An image display device production method to which the present invention is applied will next be described in detail with reference to the drawings. However, the present invention is not limited only to embodiments described below. It will be appreciated that various modifications can be made without departing from the gist of the present invention. The drawings are merely schematic representations and may not reflect actual dimensional proportions etc. The specific dimensions etc. should be determined in consideration of the following description. It will be appreciated that dimensional relations and proportions may be partially different among the drawings.

Figure 1:
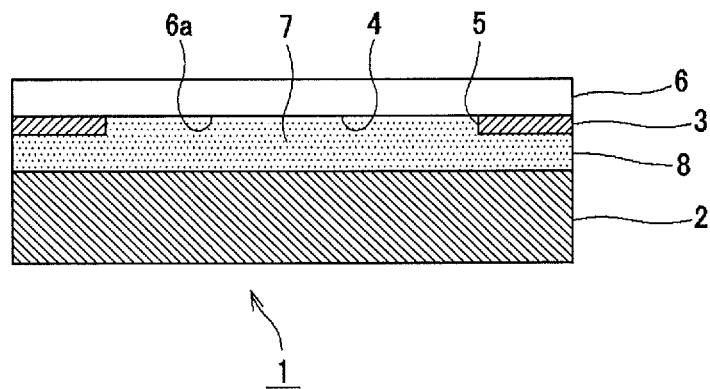
FIG. 1 is a cross-sectional view illustrating an image display device to which the present invention is applied.

An image display device 1 produced by applying the present invention includes an image display member 2 and a light-transmitting cover member 6 that are laminated through a light-transmitting resin layer 8 formed from a liquid optical resin composition 7, as shown in FIG. 1. In the light-transmitting cover member 6, a light-shielding layer 3 is formed on a circumferential edge portion, and a step portion 5 is thereby formed between the light-shielding layer 3 and a principal surface portion 4.

Examples of the image display member 2 may include liquid crystal display panels, organic EL display panels, plasma display panels, and touch panels. The touch panel means an image display-input panel produced by combining a display device such as a liquid crystal display panel and a position input device such as a touchpad.

The light-transmitting cover member 6 need only have light-transmitting properties that allow an image formed on the image display member to be visible, and examples thereof may include plate-shaped materials and sheet-shaped materials such as glass, acrylic resins, polyethylene terephthalate, polyethylene naphthalate, and polycarbonate. These materials may be subjected to hard coating treatment, antireflection treatment, etc. on one side or both sides. The thickness and physical properties, such as elasticity, of the light-transmitting cover member 6 may be appropriately determined according to its intended purpose.

In the light-transmitting cover member 6, the light-shielding layer 3 is formed along the circumferential edge portion of a surface 6a to be laminated to the image display member 2, and the surface 6a includes the principal surface portion 4 surrounded by the light-shielding layer 3. The light-shielding layer 3 is provided in order to, for example, increase the contrast of an image and formed by applying a colored coating such as a black coating using, for example, a screen printing method and then drying and curing the coating. The thickness of the light-shielding layer 3 is generally 5 to 100 μm, and this thickness corresponds to the step portion 5 between the light-shielding layer 3 and the principal surface portion 4.

Preferably, a liquid photocurable resin composition is used for the optical resin composition 7 applied to the surface 6a of the light-transmitting cover member 6 because the resin composition is pre-cured and then post-cured by irradiation with ultraviolet rays, as described later. In the following description, a photocurable resin composition 7 is used as an example of the optical resin composition. In the image display device 1, the photocurable resin composition 7 in liquid form is used, and the photocurable resin composition 7 is applied to a thickness larger than the thickness of the light-shielding layer 3. This can cancel the step portion 5 formed between the light-shielding layer 3 and the surface 6a of the light-transmitting cover member 6 on which the light-shielding layer is formed. The term "liquid (form)" means a substance that shows the viscosity measured by a cone-plate viscometer of 0.01 to 100 Pa·s (25° C.)

Preferred examples of the above photocurable resin composition 7 may include a photocurable resin composition containing, as main components, an acrylate-based oligomer component (component (A)), an acrylate-based monomer component (component (B)), and a photopolymerization initiator (component (C)). The final curing shrinkage ratio of the photocurable resin composition 7 is 3% or higher.

The "final curing shrinkage ratio" means a curing shrinkage ratio generated between the photocurable resin composition 7 in an uncured state and the composition 7 in a completely cured state. The term "completely cured" means that the curing rate of the cured resin composition is at least 90%, as described later. Hereinafter, the final curing shrinkage ratio is referred to as a total curing shrinkage ratio. The curing shrinkage ratio generated between the photocurable resin composition 7 in an uncured state and the composition 7 in a pre-cured state is referred to as a pre-curing shrinkage ratio. The curing shrinkage ratio generated between the photocurable resin composition in a pre-cured state and the composition in a completely cured state in a post-curing step is referred to as a post-curing shrinkage ratio.

The total curing shrinkage ratio of the photocurable resin composition 7 can be computed as follows. The specific gravity of the uncured composition (i.e., the composition before curing) and the specific gravity of the completely cured solid product after complete curing are measured using an electronic densimeter (SD-120L, manufactured by Alfa Mirage Co., Ltd.), and the total curing shrinkage ratio can be computed from the difference in the specific gravity using the following formula. The pre-curing shrinkage ratio of the pre-cured resin product of the photocurable resin composition 7 can be computed as follows. The specific gravity of the uncured composition (i.e., the composition before curing) and the specific gravity of the pre-cured solid product after pre-curing are measured using the electronic densimeter (SD-120L, manufactured by Alfa Mirage Co., Ltd.), and the pre-curing shrinkage ratio is computed from the difference in the specific gravity using a formula below. The post-curing shrinkage ratio can be computed by subtracting the pre-curing shrinkage ratio from the total curing shrinkage ratio.

Total curing shrinkage ratio (%)=[(specific gravity of completely cured product−specific gravity of uncured composition)/specific gravity of completely cured product]×100

Pre-curing shrinkage ratio (%)=[(specific gravity of pre-cured product−specific gravity of uncured composition)/specific gravity of pre-cured product]×100

Post-curing shrinkage ratio (%)=total curing shrinkage ratio−pre-curing shrinkage ratio The component (A), i.e., the acrylate-based oligomer, is used as the base material of the photocurable resin composition 7. Preferred examples of the acrylate-based oligomer may include (meth)acrylate oligomers modified by polyisoprene, polyurethane, polybutadiene, etc. (such as polyisoprene-based (meth)acrylate oligomers, polyurethane-based (meth)acrylate oligomers, and polybutadiene-based (meth)acrylate oligomers). The term "(meth)acrylate" as used herein is intended to encompass acrylate and methacrylate.

Preferred specific examples of the polyisoprene-based (meth)acrylate oligomers may include esterified products of 2-hydroxyethyl methacrylate and a maleic anhydride adduct of polyisoprene polymer (such as UC102 (polystyrene-equivalent molecular weight: 17,000), Kuraray Co., Ltd.; UC203 (polystyrene-equivalent molecular weight: 35,000), Kuraray Co., Ltd.; and UC-1 (molecular weight: about 25,000), Kuraray Co., Ltd.).

Preferred specific examples of the polyurethane-based (meth)acrylate oligomers may include aliphatic urethane acrylate oligomers (such as EBECRYL 230 (molecular weight: 5,000), Daicel-Allnex Ltd.; and UA-1, Light Chemical Industries Co., Ltd.)).

The polybutadiene-based (meth)acrylate oligomer used may be any known oligomer.

The component (B), i.e., the acrylate-based monomer component, is used as a reactive diluent to impart sufficient reactivity, application properties, etc. to the photocurable resin composition in the process of producing the image display device. Examples of such an acrylate-based monomer may include 2-hydroxypropyl methacrylate, benzyl acrylate, and dicyclopentenyloxyethyl methacrylate.

Any known photo-radical polymerization initiator may be used as the component (C), i.e., the photopolymerization initiator. Examples of the photopolymerization initiator may include 1-hydroxy-cyclohexyl phenyl ketone (IRGACURE 184, BASF Japan Ltd.), 2-hydroxy-1-{4-[4-(2-hydroxy-2-methyl-propionyl)benzyl]phenyl}}-2-methyl-1-propan-1-one (IRGACURE 127, BASF Japan Ltd.)), benzophenone, and acetophenone.

If the amount of the photopolymerization initiator with respect to 100 parts by mass of the total of the component (A), i.e., the acrylate-based oligomer, and the component (B), i.e., the acrylate-based monomer, is too small, the degree of curing after irradiation with ultraviolet rays is insufficient. If the amount is too large, the amount of outgassing due to cleavage tends to become large, and this causes a foaming problem. Therefore, the amount of the photopolymerization initiator is preferably 0.1 to 5 parts by mass and more preferably 0.2 to 3 parts by mass.

The photocurable resin composition may further contain component (D), a plasticizer component. The component (D), i.e., the plasticizer component, is used to impart cushioning properties to the cured resin layer and to reduce the curing shrinkage ratio of the photocurable resin composition. Under irradiation with ultraviolet rays, the plasticizer component does not react with the component (A), i.e., the acrylate-based oligomer component, and the component (B), i.e., the acrylate-based monomer component. The above plasticizer component contains a solid tackifier (1) and a liquid oil component (2).

Examples of the solid tackifier (1) may include: terpene-based resins such as terpene resins, terpene phenol resins, and hydrogenated terpene resins; rosin resins such as natural rosin, polymerized rosin, rosin esters, and hydrogenated rosin; and terpene-based hydrogenated resins. In addition, non-reactive oligomers prepared by polymerizing the above-described acrylate-based monomers to have a low molecular weight can be used. Specific examples of such oligomers may include copolymers of butyl acrylate, 2-hexyl acrylate, and acrylic acid and copolymers of cyclohexyl acrylate and methacrylic acid.

The liquid oil component (2) contained may be polybutadiene-based oil or polyisoprene-based oil.

The photocurable resin composition 7 may further contain a chain transfer agent to adjust its molecular weight. Examples of the chain transfer agent may include 2-mercaptoethanol, lauryl mercaptan, glycidyl mercaptan, mercaptoacetic acid, thioglycolic acid 2-ethylhexyl ester, 2,3-dimethylmercapto-1-propanol, and an α-methylstyrene dimer.

If necessary, the photocurable resin composition 7 may further contain general additives such as an antioxidant and a bonding improver, for example, a silane coupling agent.

In the photocurable resin composition 7, its curing shrinkage ratio in a post-curing step after a pre-curing step described later is suppressed to less than 3%. Basically, it is not necessary to contain the plasticizer component, but the photocurable resin composition 7 may contain the plasticizer component (component (D)) within the range in which the effects of the present invention are not impaired. The total amount of the component (A), i.e., the acrylate-based oligomer component, and the component (B), i.e., the acrylate-based monomer component, contained in the photocurable resin composition is preferably 25 to 85% by mass. However, the content of the component (D), i.e., the plasticizer component, is within the range of 0 to 65% by mass.

First Embodiment

Figure 2:
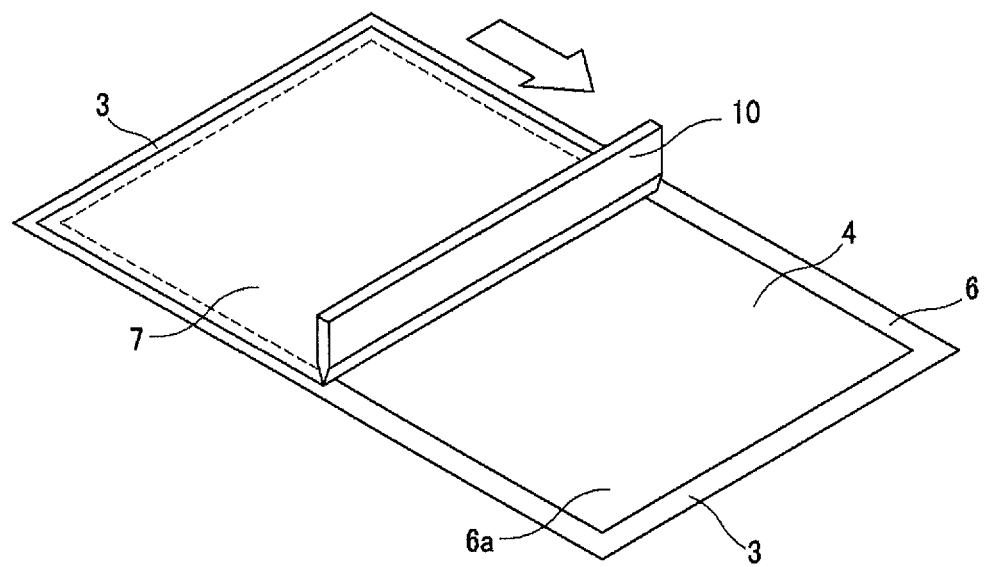
FIG. 2 is a perspective view illustrating the step of applying a photocurable resin composition to the surface of a light-transmitting cover member using a resin dispenser.

Next, a method of producing the image display device 1 described above will be described. As shown in FIG. 2, in the image display device production method according to a first embodiment, a resin dispenser 10 is moved from one lengthwise end of the surface 6a, which is the light-shielding layer-formed surface of the light-transmitting cover member 6, toward the other end to apply the liquid photocurable resin composition 7 to the surface 6a of the light-transmitting cover member 6. In this case, moving speeds are changed on the light-shielding layer 3 and on the principal surface portion 4 of the surface 6a of the light-transmitting cover member 6.

[Application Step]

Figure 3:
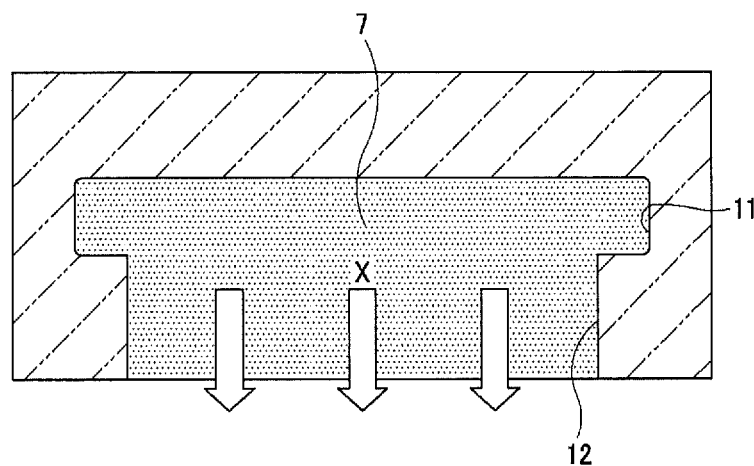
FIG. 3 is a cross-sectional view of the resin dispenser.

As shown in FIG. 3, the resin dispenser 10 for applying the photocurable resin composition 7 to the surface 6a of the light-transmitting cover member 6 includes a storage portion 11 for storing the photocurable resin composition 7 and a discharge port 12 for discharging the photocurable resin composition 7 in the storage portion 11 onto the surface 6a of the light-transmitting cover member 6.

Figure 4:
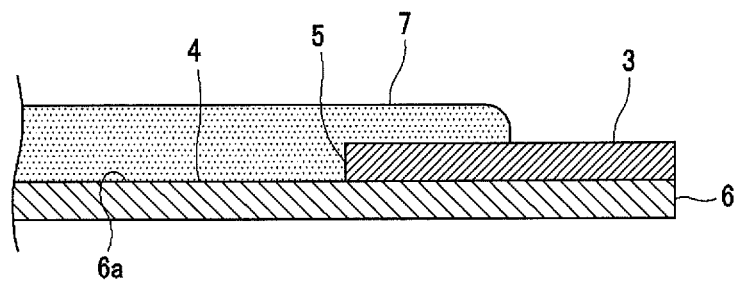
FIG. 4 is a cross-sectional view illustrating a circumferential edge portion of the light-transmitting cover member coated with the photocurable resin composition.

In the resin dispenser 10, the discharge port 12 has a width larger than the width of the principal surface portion 4 of the light-transmitting cover member 6, and the width of the discharge port 12 extends across both the principal surface portion 4 and each of the light-shielding layers 3, 3 formed on opposite sides in the direction of the width. Therefore, as shown in FIG. 4, the resin dispenser 10 applies the photocurable resin composition 7 to the light-transmitting cover member 6 such that the applied photocurable resin composition 7 extends across both the principal surface portion 4 and each of the light-shielding layers 3, 3 formed on the opposite sides in the width direction of the light-transmitting cover member 6.

In the resin dispenser 10, the discharge port 12 is formed so as to have the same width in a discharge direction X of the photocurable resin composition 7. This allows the resin dispenser 10 to discharge the photocurable resin composition 7 uniformly over the entire width of the discharge port 12.

As shown in FIG. 2, while the resin dispenser 10 is moved from one lengthwise end of the surface 6a of the light-transmitting cover member 6 toward the other lengthwise end with the width direction of the discharge port 12 being parallel to the width direction of the light-transmitting cover member 6, the liquid photocurable resin composition 7 is extruded using an unillustrated pump and applied to the principal surface portion 4 and each of the light-shielding layers 3, 3 so as to extend across both of them.

During the application, the resin dispenser 10 is moved at different moving speeds on the principal surface portion 4 formed in a central region in the moving direction and on the light-shielding layer 3 that are formed at its opposite ends in the moving direction. In this manner, the resin dispenser 10 can apply the photocurable resin composition 7 in the lengthwise direction of the light-transmitting cover member 6 such the height of the applied resin composition is the same on the light-shielding layer 3 and on the principal surface portion 4, and the formed coating surface can be flat over each of the light-shielding layers 3, 3 and the principal surface portion 4.

Figure 15:
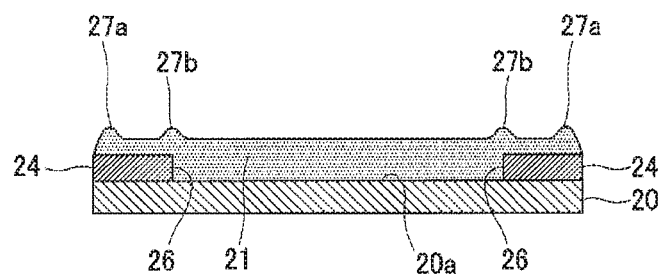
FIG. 15 is a cross-sectional view illustrating a coated surface prepared by applying a photocurable resin composition to the surface of a conventional light-transmitting cover member.

As described above, the resin dispenser 10 has the discharge port 12 formed to have the same width in the discharge direction X of the photocurable resin composition 7 and discharges the photocurable resin composition 7 uniformly over the entire width of the discharge port 12. Therefore, when the resin dispenser 10 is moved at a constant speed from one lengthwise end of the light-transmitting cover member 6 toward the other lengthwise end, protrusions are formed on the one lengthwise end and the other lengthwise end of the light-transmitting cover member 6 and near the boundaries between the light-shielding layer 3 and the principal surface portion 4 (see FIG. 15).

Figure 5:
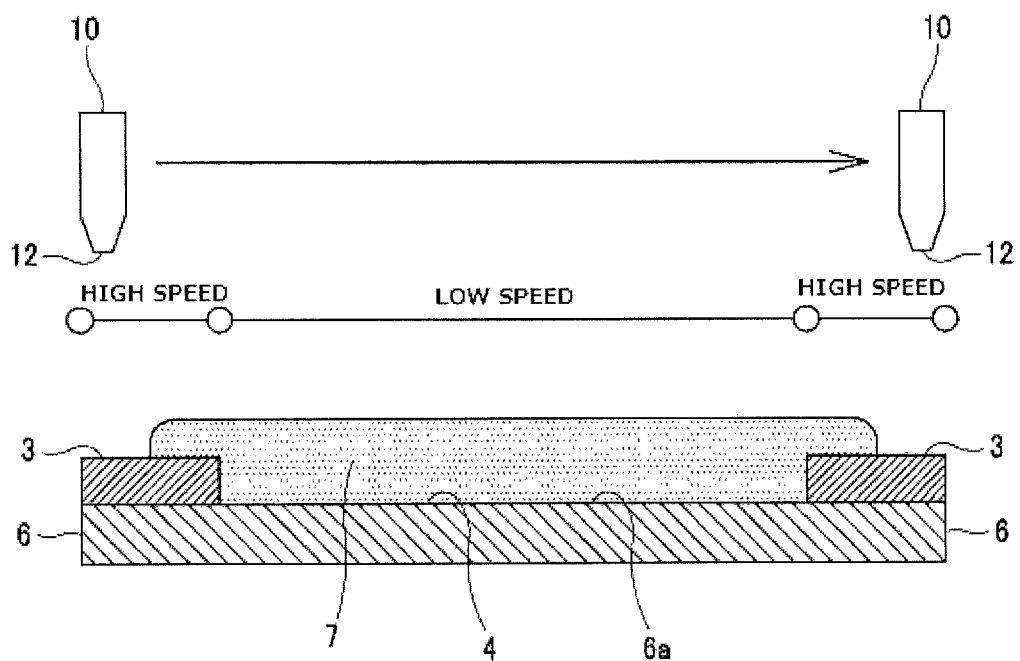
FIG. 5 is a cross-sectional view illustrating the step of applying the photocurable resin composition to the surface of the light-transmitting cover member using the resin dispenser.

Therefore, in this embodiment, the moving speed of the resin dispenser 10 is set to be high on the light-shielding layer 3 formed on the one end and the other end of the light-transmitting cover member 6 and set to be low on the principal surface portion 4, as shown in FIG. 5. In this manner, the resin dispenser 10 can apply the photocurable resin composition 7 such that the height of the applied resin composition is the same on the light-shielding layer 3 and on the principal surface portion 4, so that a flat coating surface can be formed in the lengthwise direction of the light-transmitting cover member 6.

The moving speed can be set to an optimal speed according to the viscosity of the photocurable resin composition 7, the height of the step portion 5, etc. such that the photocurable resin composition 7 can be applied evenly over the light-shielding layer 3, 3 and the principal surface portion 4. If high protrusions are formed, the moving speed on the light-shielding layer 3 is set to be still higher than that on the principal surface portion 4. In this manner, the amount of the photocurable resin composition 7 applied to the light-shielding layer 3 becomes still smaller than that to the principal surface portion 4, so that the photocurable resin composition 7 can be applied evenly.

Figure 6:
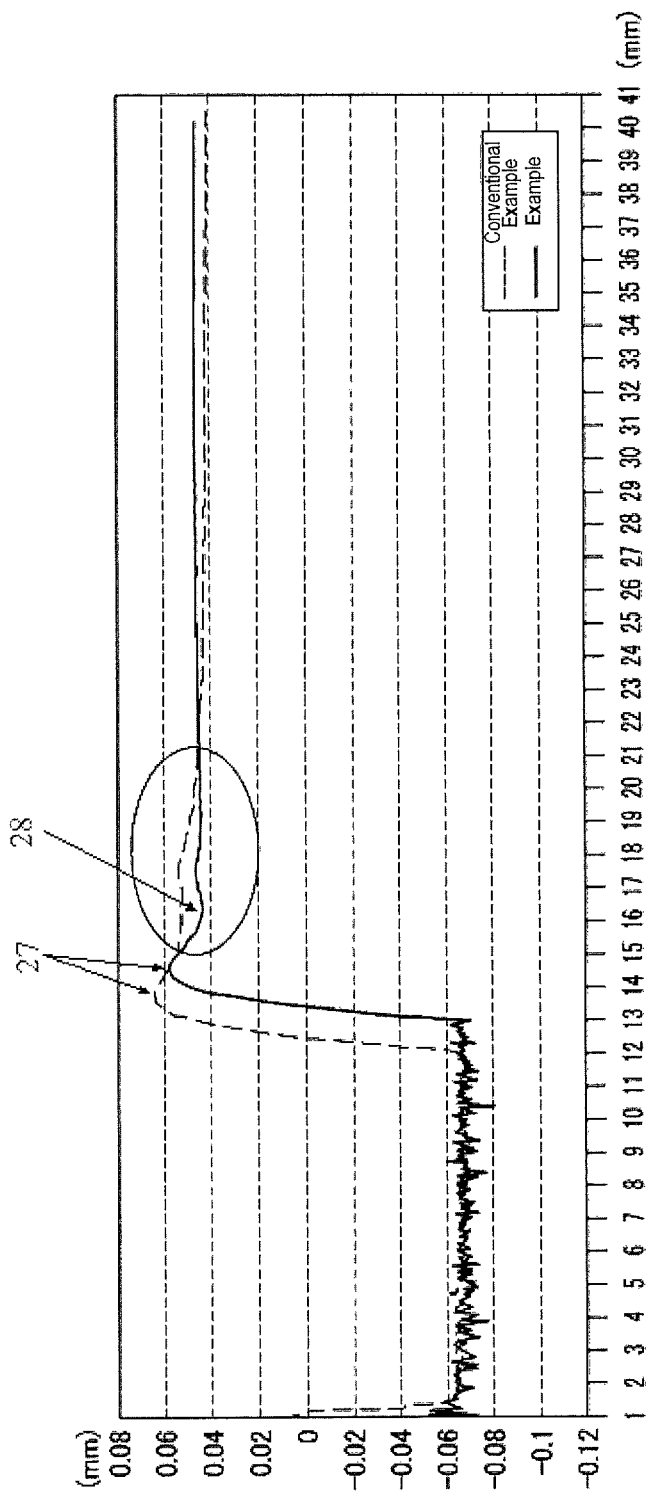
FIG. 6 is a graph showing irregularities on the surface coated with the photocurable resin composition in each of an Example and a Conventional Example.

FIG. 6 is a graph showing the results of measurement on the surface coated with the photocurable resin composition 7 using a displacement sensor in each of a Conventional Example and an Example. In the Conventional Example, the resin dispenser 10 was moved at a constant speed. In the Example, the resin dispenser 10 was moved at a high speed on the light-shielding layer 3 and at a low speed on the principal surface portion 4. The vertical axis represents height, and the horizontal axis represents the distance from one lengthwise end of the light-transmitting cover member 6. The moving speed of the resin dispenser 10 was 16 mm/sec on the principal surface portion 4 of the light-transmitting cover member 6 and was 24 mm/sec on the light-shielding layer 3, i.e., 1.5 times the moving speed on the principal surface portion 4. The thickness of the surface coated with the photocurable resin composition 7 was about 150 μm on the principal surface portion 4 of the light-transmitting cover member 6 and about 40 μm on the light-shielding layer 3.

As shown in FIG. 6, in the Example, since the application amount of the photocurable resin composition 7 on the light-shielding layer 3 was reduced, protrusions 27 on the ends of the light-transmitting cover member 6 and on the circumference of the step portion 5 became low, and the surface was found to be flatter.

The flatness of the photocurable resin composition 7 can be measured by scanning the applied photocurable resin composition 7 with a known displacement sensor that irradiates the resin composition with laser light, LED light, ultrasonic waves, etc. to measure the height.

As described above, by adjusting the difference between the speed on the light-shielding layer 3 and the speed on the principal surface portion 4 with reference to the state of protrusions formed in the application step previously performed, the application amounts can be controlled, and the speed can be set such that the photocurable resin composition 7 can be applied evenly over the light-shielding layer 3 and the principal surface portion 4. If the moving speed on the light-shielding layer 3 is too high, recesses 28 are formed near the boundaries between the light-shielding layer 3 and the principal surface portion 4. In this case, the moving speed on the light-shielding layer 3 is reduced for adjustment.

The photocurable resin composition 7 need only be applied across both the principal surface portion 4 and the light-shielding layer 3 and is not necessarily applied to the entire light-shielding layer 3. In order to apply the photocurable resin composition 7 to the entire light-shielding layer 3, the resin dispenser 10 must discharge the photocurable resin composition 7 before it reaches the light-shielding layer 3. This is uneconomical, and also the application step becomes complicated due to the occurrence of sagging of the resin etc. So long as the photocurable resin composition 7 applied is present on the light-shielding layer 3 as shown in FIG. 4, the photocurable resin composition 7 spreads over the entire light-shielding layer 3 in the step of laminating the image display member 2, and therefore the light-transmitting cover member 6 and the image display member 2 can be connected to each other without any problem.

Therefore, it is preferable that an idling region in which the resin dispenser 10 does not discharge the photocurable resin composition 7 onto preferably the light-shielding layer be provided at the beginning and end of the movement of the resin dispenser 10 from one lengthwise end of the light-transmitting cover member 6 to the other lengthwise end.

In the step of applying the photocurable resin composition 7 described above, planarization is achieved by controlling the moving speed of the resin dispenser 10. However, planarization may be achieved by adjusting the pump such that the discharged amount on the light-shielding layer 3 is smaller than the discharged amount on the principal surface portion 4 while the resin dispenser 10 is moved at a constant speed. However, controlling the discharge amount by adjusting the pump is more complicated than controlling the moving speed. Therefore, the method in which the moving speed of the resin dispenser 10 is controlled is better in terms of the simplicity of the application step and yield.

In addition to moving the resin dispenser 10 relative to the fixed light-transmitting cover member 6 as described above, the resin dispenser 10 may be fixed, and the light-transmitting cover member 6 may be moved while its speed is controlled in the manner described above.

[Pre-Curing Step]

Figure 7:
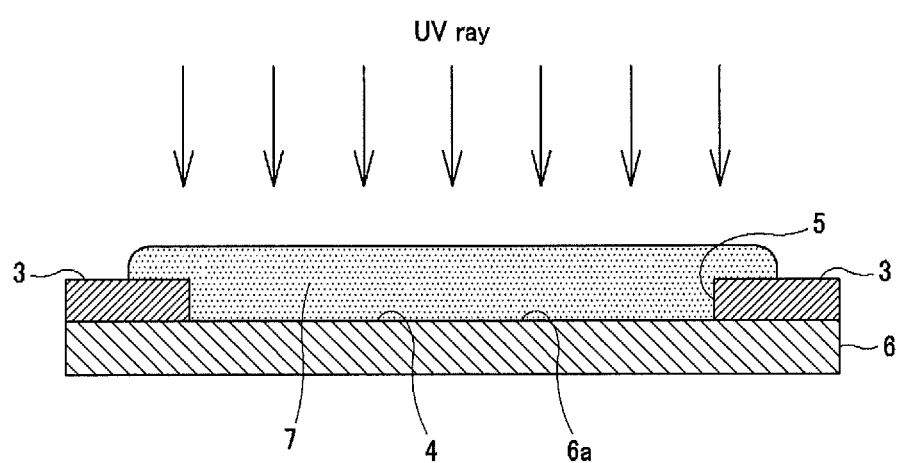
FIG. 7 is a cross-sectional view illustrating the step of irradiating the photocurable resin composition applied to the surface of the light-transmitting cover member with ultraviolet rays.
Figure 8:
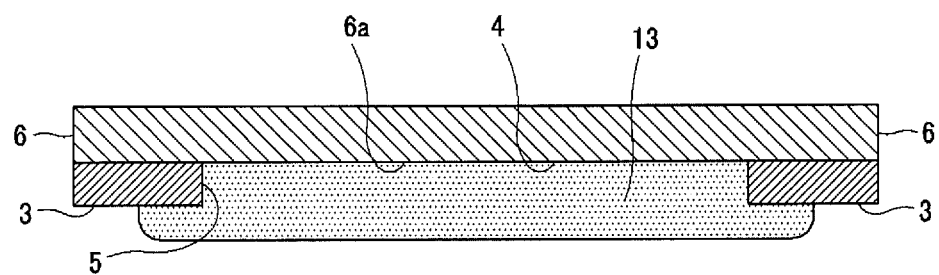
FIG. 8 is a cross-sectional view illustrating the light-transmitting cover member with a pre-cured resin layer formed on the surface thereof.

After completion of the step of applying the photocurable resin composition 7 to the light-transmitting cover member 6, the photocurable resin composition 7 is then irradiated with ultraviolet rays as shown in FIG. 7 to pre-cured the resin composition to thereby form a pre-cured resin layer 13 (see FIG. 8). The pre-curing is performed in order to render the photocurable resin composition 7 in liquid form less flowable so that the resin composition is prevented from running down when the cover member is turned upside down as shown in FIG. 8 to thereby improve handleability. By pre-curing the resin composition as described above, the light-transmitting cured resin layer between the light-shielding layer 3 and the image display member can be sufficiently photo-cured without being excluded from the space between the light-shielding layer 3 and the image display member, and curing shrinkage can also be reduced. The degree of pre-curing is such that the curing rate (gel fraction) of the pre-cured resin layer 13 is preferably 10 to 80% and more preferably 30 to 60%. The curing rate (gel fraction) is a value defined as the ratio of the amount of (meth)acryloyl groups present in the photocurable resin composition 7 after irradiation with ultraviolet rays to the amount of (meth)acryloyl groups present before irradiation with ultraviolet rays (the ratio of the amount consumed). This shows that the larger the value of the curing rate is, the higher the degree of progress of curing is.

The curing rate (gel fraction) can be computed by substituting, into the following formula (1), the height (X) of an absorption peak at 1640 to 1620 $cm^{-1}$ from the base line in an FT-IR measurement chart of the resin composition layer before irradiation with ultraviolet rays and the height (Y) of the absorption peak at 1640 to 1620 $cm^{-1}$ from the base line in an FT-IR measurement chart of the resin composition layer after irradiation with ultraviolet rays.

$$\text{Curing rate } (\%) = \{(X-Y)/X\} \times 100 \quad (1)$$

No particular limitation is imposed on the type and power of the light source, the cumulative light amount, etc. when the irradiation with ultraviolet rays is performed, so long as the resin composition can be pre-cured such that the curing rate (gel fraction) is preferably 10 to 80%. Any known conditions for a photo-radical polymerization process for (meth)acrylate by irradiation with ultraviolet rays can be used.

Preferably, the conditions for irradiation with ultraviolet rays are selected such that the curing rate is within the range described above and no sagging and deformation of the pre-cured resin layer 13 occur during a lamination operation described later. The conditions under which the sagging and deformation do not occur may be expressed in terms of viscosity, and the viscosity is 20 Pa·S or more (cone-plate rheometer, 25° C., cone/plate C35/2, number of revolutions: 10 rpm).

Preferably, the conditions for irradiation with ultraviolet rays are selected such that the curing rate is within the range described above and the pre-cured resin layer 13 can maintain its surface stickiness (tackiness) during the lamination operation described later. The conditions under which the stickiness can be maintained may be expressed in terms of a measurement value obtained by a probe tack method (RHESCA method: a method including placing a sample with its adhesive surface facing up, pressing the probe against the adhesive surface from above, and then peeling the probe) using a tacking tester (TAC-1000, RHESCA Co., Ltd.), and the measurement value is 30 N/$mm^2$ or more (see "Method of measuring physical properties of adhesive material" in http://www.rhesca.co.jp/main/technical/technical.html).

[Laminating Step]

Figure 9:
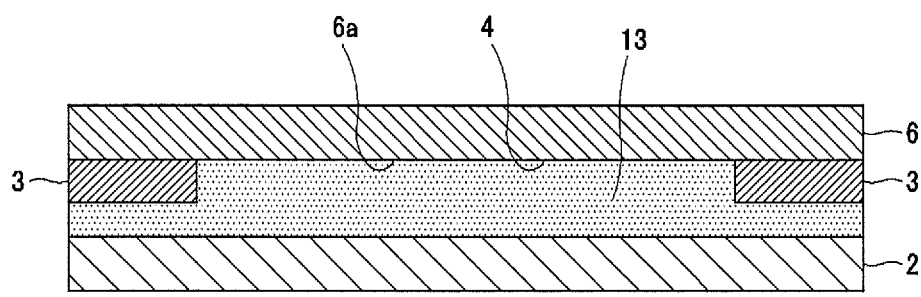
FIG. 9 is a cross-sectional view illustrating the light-transmitting cover member and an image display member that are laminated through the pre-cured resin layer.

Next, as shown in FIG. 9, the light-transmitting cover member 6 is laminated to the image display member 2 with the pre-cured resin layer 13 facing thereto. The lamination can be performed by applying pressure at 10° C. to 80° C. using a known compression bonding device.

[Post-Curing Step]

Figure 10:
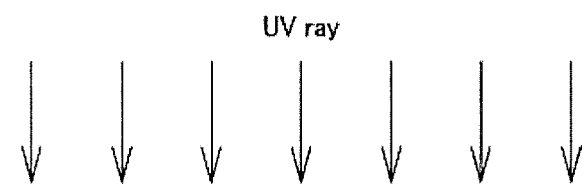
FIG. 10 is a cross-sectional view illustrating the step of further irradiating the pre-cured resin layer with ultraviolet rays to post-cure the pre-cured resin layer.
Figure 10:
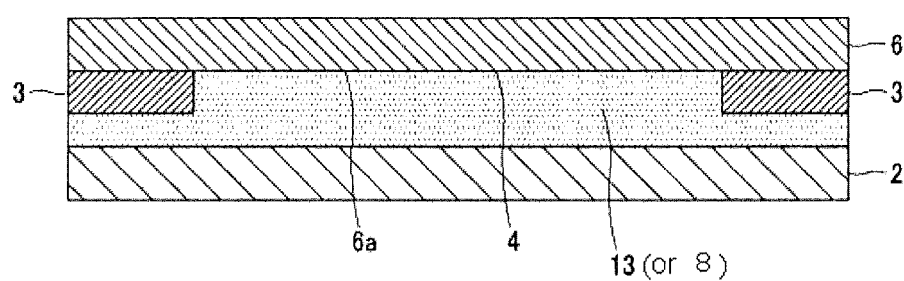

Next, as shown in FIG. 10, the pre-cured resin layer 13 held between the image display member 2 and the light-transmitting cover member 6 is irradiated with ultraviolet rays to post-cure the pre-cured resin layer 13. If necessary, the resin layer between the light-shielding layer of the light-transmitting cover member 6 and the image display member 2 is irradiated with ultraviolet rays to post-cure the resin layer. In this manner, the image display member 2 and the light-transmitting cover member 6 are laminated through a light-transmitting cured resin layer 8 to thereby obtain an image display device 1.

The post-curing in this step is performed in order to sufficiently cure the pre-cured resin layer 13 to thereby bond and laminate the image display member 2 to the light-transmitting cover member 6. The degree of post-curing is such that the curing rate (gel fraction) of the light-transmitting cured resin layer 8 is preferably 90% or higher and more preferably 95% or higher.

The degree of light transmitting properties of the light-transmitting cured resin layer 8 need only be such that an image formed on the image display member 2 is visible.

Second Embodiment

Next, another method of producing the above-described image display device 1 will be described. The image display device production method according to a second embodiment includes applying the liquid photocurable resin composition 7 to the surface 6a of the light-transmitting cover member 6 using a resin dispenser 15. In the resin dispenser 15, the width between opposite end portions 14a of a discharge port 14 that face the light-shielding layer 3 of the light-transmitting cover member 6 is made larger than the width of a central portion 14b of the discharge port 14 that faces the principal surface portion 4.

Figure 11:
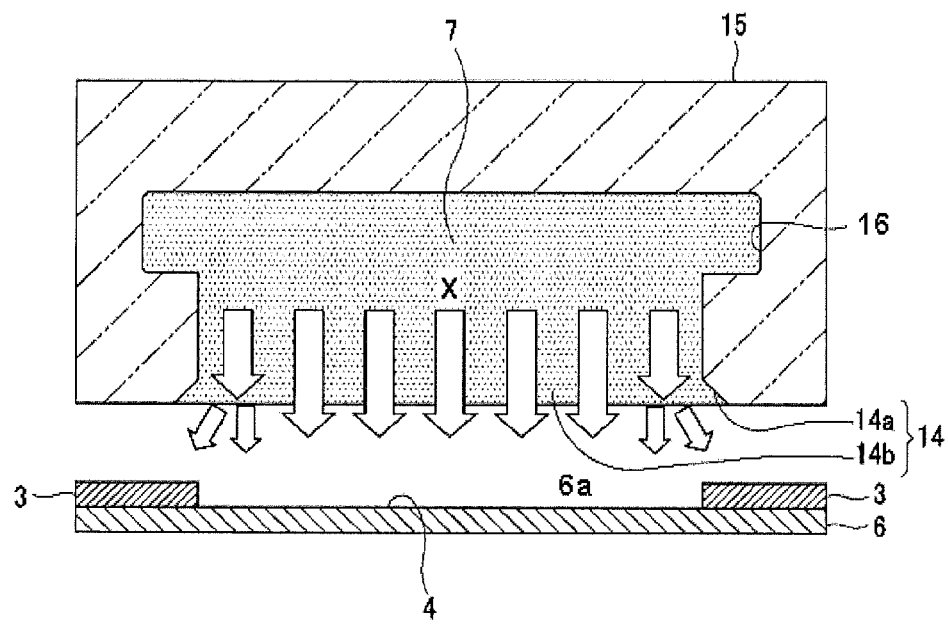
FIG. 11 is a cross-sectional view illustrating a resin dispenser to which the present invention is applied.

As shown in FIG. 11, the resin dispenser 15 includes a storage portion 16 for storing the photocurable resin composition 7 and the discharge port 14 for discharging the photocurable resin composition 7 in the storage portion 16 toward the surface 6a of the light-transmitting cover member 6.

In the resin dispenser 15, as in the above-described resin dispenser 10, the discharge port 14 has a width larger than the width of the principal surface portion 4 of the light-transmitting cover member 6, and the width of the discharge port 14 extends across both the principal surface portion 4 and each of the light-shielding layers 3, 3 formed on opposite sides in the direction of the width. Therefore, the resin dispenser 15 applies the photocurable resin composition 7 to the light-transmitting cover member 6 such that the applied photocurable resin composition 7 extends across both the principal surface portion 4 and each of the light-shielding layers 3, 3 formed on opposite sides in the width direction (see FIG. 4).

In the resin dispenser 15, the width between the opposite end portions 14a of the discharge port 14 that face the light-shielding layer 3 of the light-transmitting cover member 6 is larger than the width of the central portion 14b that faces the principal surface portion 4. Specifically, a tapered surface is formed in each of the opposite end portions 14a, so that the width between the tapered surfaces gradually increases from the central portion 14b. Accordingly, in the resin dispenser 15, the width between the opposite end portions 14a of the discharge port 14 increases in the discharge direction x of the photocurable resin composition 7, and the photocurable resin composition 7 supplied from the central portion 14b is distributed toward the opposite end portions 14a and then discharged. Therefore, with the resin dispenser 15, the discharge amount on the light-shielding layer 3 can be made smaller than the discharge amount on the principal surface portion 4.

While the resin dispenser 15 is moved from one lengthwise end of the surface 6a of the light-transmitting cover member 6 toward the other lengthwise end with the discharge port 14 being parallel to the width direction of the light-transmitting cover member 6, the liquid photocurable resin composition 7 is extruded using an unillustrated pump and applied to the principal surface portion 4 and each of the light-shielding layers 3, 3 so as to extend across both of them.

In this case, since the width between the opposite end portions 14a of the discharge port 14 of the resin dispenser 15 that face the light-shielding layer 3 of the light-transmitting cover member 6 is larger than the width of the central portion 14b facing the principal surface portion 4, the photocurable resin composition 7 can be applied such that the height of the applied resin composition is the same on the light-shielding layer 3 and on the principal surface portion 4 over the entire width of the light-transmitting cover member 6, so that a flat coating surface can be formed.

The opposite end portions 14a of the discharge port 14 of the resin dispenser 15 are formed to have an optimal angle and an optimal height according to the viscosity of the photocurable resin composition 7, the height of the step portion 5, etc. such that the photocurable resin composition 7 can be applied evenly over each of the light-shielding layers 3, 3 and the principal surface portion 4.

[Height of Resin Dispenser 15]

Figure 12:
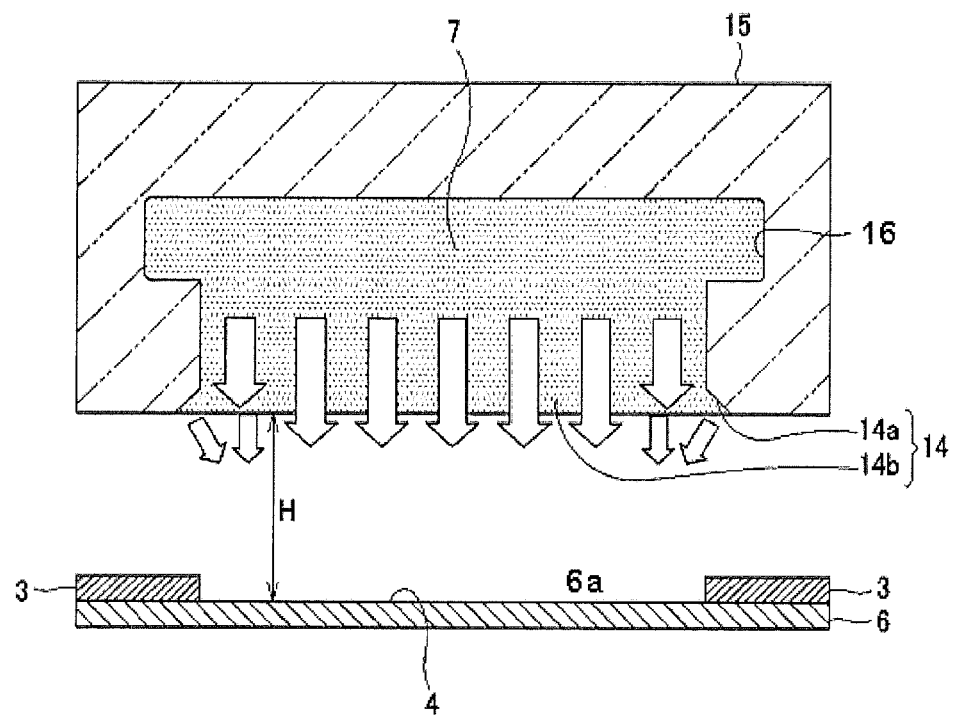
FIG. 12 is a cross-sectional view illustrating the resin dispenser to which the present invention is applied, when the height of a discharge port from the surface of the light-transmitting cover member is too large.

Preferably, in the resin dispenser 15, the height H of the front end of the discharge port 14 from the surface 6a of the light-transmitting cover member 6 is adjusted when the photocurable resin composition 7 is discharged. As shown in FIG. 12, if the height H of the front end of the discharge port 14 from the surface 6a of the light-transmitting cover member 6 is too large, the photocurable resin composition 7 dispersed toward each of the opposite end portions 14a is concentrated in one place by tension before applied to the light-shielding layer 3 and accumulated near a widthwise end portion of the light-transmitting cover member 6. Therefore, a protrusion of the photocurable resin composition 7 is formed near the end portion of the light-transmitting cover member 6 (see FIG. 13).

Figure 13:
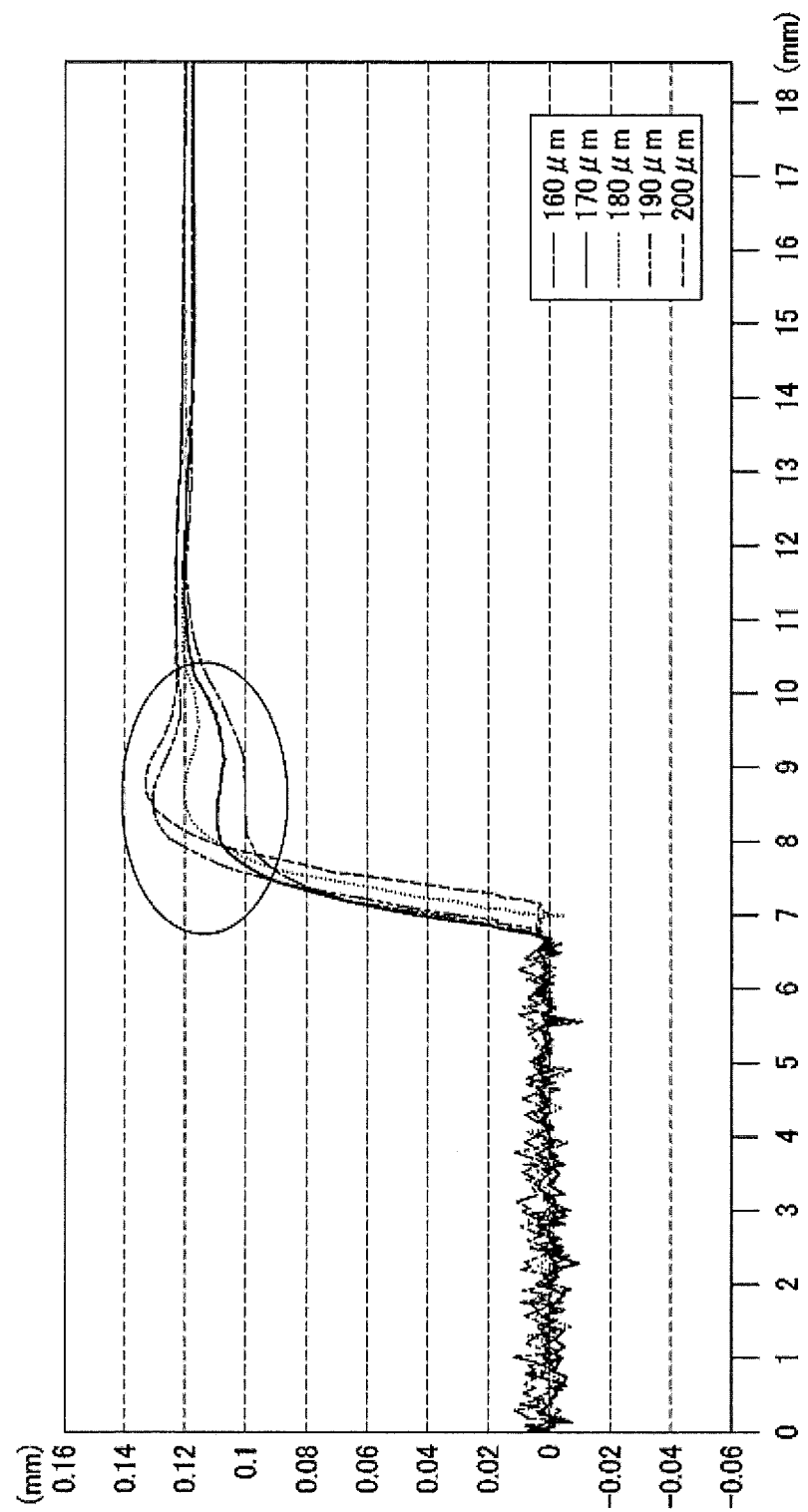
FIG. 13 is a graph showing irregularities on surfaces coated with the photocurable resin composition using the resin dispenser at different heights.
Figure 14:
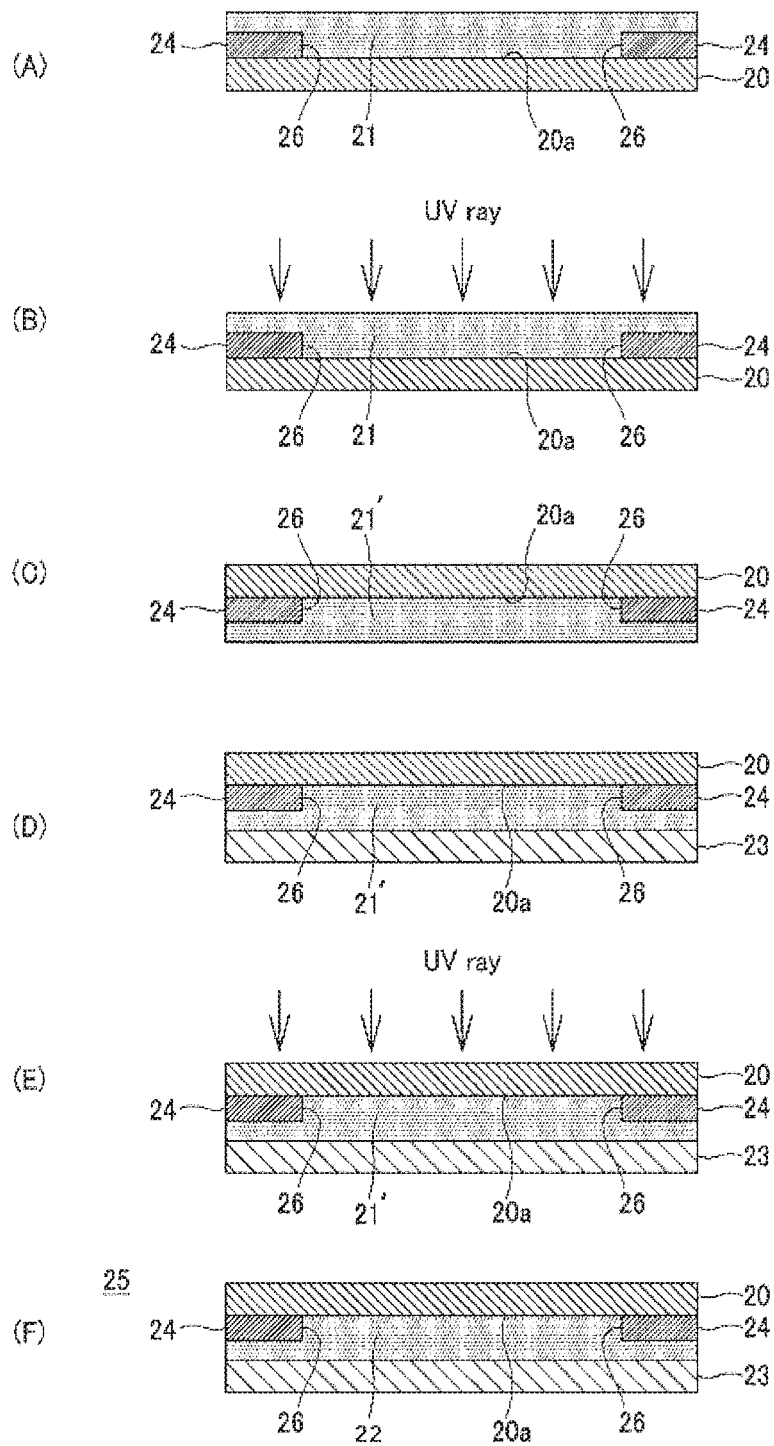
FIG. 14 is a series of cross-sectional views illustrating a conventional process for producing an image display device.

In contrast, if the height H of the front end of the discharge port 14 from the surface 6a of the light-transmitting cover member 6 is too low, the photocurable resin composition 7 does not sufficiently spread from the opposite end portions 14a toward the light-shielding layer 3, and a recess extending from the light-shielding layer 3 to the principal surface portion 4 is formed (see FIG. 13).

Therefore, in the resin dispenser 15, if a high protrusion is formed, the front end of the discharge port 14 is brought closer to the surface 6a of the light-transmitting cover member 6. If a recess 28 is formed, the front end of the discharge port 14 is moved away from the surface 6a of the light-transmitting cover member 6.

As described above, the resin dispenser 15 adjusts the height H of the front end of the discharge port 14 from the principal surface 6a of the light-transmitting cover member 6 with reference to the state of irregularities generated near the boundaries between the principal surface portion 4 and the light-shielding layer 3 in the application step previously performed. In this manner, the resin dispenser 15 can control the amount of the photocurable resin composition 7 applied and can thereby set the height H such that the photocurable resin composition 7 can be applied evenly over the light-shielding layer 3 and the principal surface portion 4.

FIG. 13 is a graph showing the results of measurement, using a displacement sensor, on surfaces coated with the photocurable resin composition 7 using the resin dispenser 15. The measurement was performed with the front end of the discharge port 14 placed at different heights H from the surface 6a of the light-transmitting cover member 6, and each coated surface was measured with the displacement sensor. The vertical axis represents height, and the horizontal axis represents the distance from one widthwise end of the light-transmitting cover member 6. As can be seen from FIG. 13, when the height H of the front end of the discharge port 14 from the principal surface 6a of the light-transmitting cover member 6 is too high, i.e., 190 µm or 200 µm, a protrusion is formed near a widthwise end of the light-transmitting cover member 6. When the height is too low, i.e., 160 µm or 170 µm, a recess is formed. When the height H is 180 µm, the photocurable resin composition 7 can be applied substantially evenly.

The resin dispenser 15 can apply the photocurable resin composition 7 evenly near the opposite widthwise end portions of the light-transmitting cover member 6 and the boundaries between the light-shielding layer 3 and the principal surface portion 4 irrespective of the moving speed. Therefore, as in the above-described application step using the resin dispenser 10, when the resin dispenser 15 is moved from one lengthwise end of the light-transmitting cover member 6 toward the other lengthwise end to apply the liquid photocurable resin composition 7 to the surface 6a of the light-transmitting cover member 6, moving speeds are changed on the light-shielding layer 3 and on the principal surface portion 4 of the surface 6a the light-transmitting cover member 6. In this manner, the photocurable resin composition 7 can be applied evenly in the lengthwise and widthwise directions of the light-transmitting cover member 6.

Third Embodiment

Next, another method of producing the image display device 1 described above will be described. In the image display device production method according to a third embodiment, the surface tension of the photocurable resin composition 7 is adjusted to apply the resin composition evenly. The photocurable resin composition 7 in the third embodiment contains an acrylate-based oligomer component (component (A)), an acrylate-based monomer component (component (B)), a photopolymerization initiator (component (C)), and a plasticizer component (component (D)), and a leveling agent may be added. In this manner, the surface can be adjusted (reduced), and the occurrence of protrusions near the boundaries between the light-shielding layer 3 and the principal surface portion 4 can be reduced.

No particular limitation is imposed on the leveling agent, and siloxane-based leveling agents such as product name BYK378 (manufactured by BYK Japan KK) and product name LH-90 (Kusumoto Chemicals, Ltd.) can be used for the composition formed from (A) to (D) above. The amount of the leveling agent added to the photocurable resin composition 7 is preferably 0.1 to 1.0 wt % and particularly preferably 0.2 to 0.6 wt %.

The photocurable resin composition 7 has a surface tension of 30 to 35 mN/m or higher when no leveling agent is added, and the addition of the leveling agent allows the surface tension to be 30 mN/m or less, particularly within the range of 28 to 24 mN/m.

Examples

Examples of the third embodiment will next be described.

First, a glass plate with a size of 45 (w)×80 (l)×0.4 (t) mm was prepared. A 4 mm-wide light-shielding layer was applied to the entire circumferential edge portion of the glass plate to a dry thickness of 40 μm using a thermosetting black ink (MRX ink, Teikoku Printing Inks Mfg. Co., Ltd.) by a screen printing method and then dried to prepare a light-shielding layer-attached glass plate.

The photocurable resin composition in Example 1 was prepared by uniformly mixing 40 parts by mass of an acrylic-based oligomer having a polyisoprene skeleton (UC203, Kuraray Co., Ltd.), 20 parts by mass of dicyclopentenyloxyethyl methacrylate (FA512M, Hitachi Chemical Co., Ltd.), 3 parts by mass of hydroxypropyl methacrylate (HPMA, Nippon Kasei Chemical Co., Ltd.), 15 parts by mass of tetrahydrofurfuryl acrylate (Light Ester THF, Kyoeisha Chemical Co., Ltd.), lauryl acrylate (Light Ester L, Kyoeisha Chemical Co., Ltd.), 20 parts by mass of a polybutadiene polymer (Polyoil 110, Degussa), 45 parts by mass of a hydrogenated terpene resin (P85, Yasuhara Chemical Co., Ltd.), and 4 parts by mass of a photopolymerization initiator (Irg184D, BASF Japan Ltd.). The surface tension of the photocurable resin composition according to Example 1 was 35 mN/m.

A photocurable resin composition according to Example 2 was prepared by adding 1 part by mass of a siloxane-based leveling agent BYK378 (manufactured by BYK Japan KK) to the composition in Example 1. The surface tension of the photocurable resin composition according to Example 2 was 25 mN/m.

Next the photocurable resin compositions according to Examples 1 and 2 were discharged using the above-described resin dispenser 15 onto the entire light-shielding layer-formed surfaces of different light-shielding layer-attached glass plates to form photocurable resin composition films each having an average thickness of 150 μm. The application conditions of the resin dispenser 15 are as follows. The application was performed at 16 mm/sec on the principal surface portion of the light-shielding layer-attached glass plate and at a speed higher by 1.5 times the above speed, i.e., 24 mm/sec, on the light-shielding layer.

The application was performed at 16 mm/sec on both the principal surface portion of the glass plate and the light-shielding layer, and this was used as Example 3.

This photocurable resin composition film was formed over substantially the entire light-shielding layer as shown in FIG. 1, and the surface coated with the photocurable resin composition 7 had a thickness of about 150 μm on the principal surface portion 4 of the light-transmitting cover member 6 and about 40 μm on the light-shielding layer 3.

The flatness of each of the photocurable resin composition films using the photocurable resin compositions 7 according to Examples 1 and 2 was measured using a displacement sensor. The heights of protrusions on the principal surface portion 4 from the coated surface were 0.02 mm or less in each of Examples 1 and 2, and a reduction in height of the protrusions was achieved.

The protrusions formed on the photocurable resin composition film according to Example 2 were lower by about 0.01 mm than the protrusions formed on the photocurable resin composition film according to Example 1. This is because since the leveling agent was added to the photocurable resin composition 7 according to Example 2 and therefore its surface tension was 25 mN/m, which was lower than that of the photocurable resin composition 7 in Example 1, the protrusions were spontaneously flattened. Specifically, it was found that it is effective to add a leveling agent to the photocurable resin composition 7 to lower the surface tension thereof.

Also in Example 3, protrusions lower by 0.003 to 0.007 mm than those of the protrusions formed on the photocurable resin composition film according to Example 1 were formed. As described above, even when the speed of the resin dispenser is unchanged, protrusions can be lowered by adding a leveling agent.

REFERENCE SIGNS LIST

1 image display device
2 image display member
3 light-shielding layer
4 principal surface portion
5 step portion
6 light-transmitting cover member
7 photocurable resin composition
8 light-transmitting cured resin layer
10, 15 resin dispenser
11, 16 storage portion
12, 14 discharge port
13 pre-cured resin layer
14a opposite end portions
14b central portion
27, 27a, 27b protrusion
28 recess

The invention claimed is:

1. A method of producing an image display device in which an image display member and a light-transmitting cover member having a principal surface portion and a circumferential edge portion on which a light-shielding layer is formed with a step portion formed between the principal surface portion and the circumferential edge portion are laminated through a light-transmitting resin layer formed from a liquid photocurable optical resin composition so that a light-shielding layer-formed surface of the light-transmitting cover member is arranged to face the image display member, the method comprising:

moving a resin dispenser from one end of the light-shielding layer-formed surface of the light-transmitting cover member toward the other end thereof to apply the optical resin composition to the light-shielding layer-formed surface of the light-transmitting cover member, and then pre-curing the optical resin composition by irradiating the optical resin composition with ultraviolet rays so that a curing rate of 10 to 80% is achieved to form a pre-cured resin layer having a surface of which tackiness is adjusted to 30 N/mm$^2$ or more as determined by a probe tack method;

laminating the pre-cured resin layer formed on the light-shielding layer-formed surface of the light-transmitting cover member to the image display member; and curing the pre-cured resin layer held between the image display member and the light-transmitting cover member by irradiating the pre-cured resin layer with ultraviolet rays through the light-transmitting cover member, wherein the resin dispenser changes an amount of the optical resin composition applied on the light-shielding layer and on the principal surface portion of the light-shielding layer-formed surface of the light-transmitting cover member.

2. The method of producing an image display device according to claim 1, wherein a relative moving speed between the resin dispenser and the light-transmitting cover member is changed to change the amount of the optical resin composition applied.

3. The method of producing an image display device according to claim 1, wherein an idling region in which the resin dispenser does not discharge the optical resin composition is provided on the light-shielding layer to thereby change the amount of the optical resin composition applied on the light-shielding layer and on the principal surface portion.

4. The method of producing an image display device according to claim 2, wherein the resin dispenser is moved on the principal surface portion of the light-shielding layer-formed surface of the light-transmitting cover member at a faster moving speed than that on the light-shielding layer.

5. The method of producing an image display device according to claim 2, wherein the moving speed of the resin dispenser is modified in consideration of an amount of irregularities generated on a circumferential edge of the step portion in an application step previously performed.

6. The method of producing an image display device according to claim 5, wherein, when a protrusion is generated on the circumferential edge of the step portion in the application step previously performed, the resin dispenser increases the moving speed thereof on the light-shielding layer so as to be higher than that on the principal surface portion, and wherein, when a recess is generated in the circumferential edge of the step portion in the application step previously performed, the resin dispenser increases the moving speed thereof on the principal surface portion so as to be higher than that on the light-shielding layer.

7. The method of producing an image display device according to claim 1, wherein the optical resin composition is applied to a thickness larger than the thickness of the light-shielding layer such that a step formed between the light-shielding layer and the light-shielding layer-formed surface of the light-transmitting cover member is cancelled.

8. The method of producing an image display device according to claim 1, wherein the image display member is a liquid crystal display panel, an organic EL panel, a plasma display panel, or a touch panel.

9. The method of producing an image display device according to claim 1, wherein the optical resin composition contains a polyurethane-based (meth)acrylate oligomer or a polyisoprene-based (meth)acrylate oligomer, and a tackifier.

10. A method of producing an image display device in which an image display member and a light-transmitting cover member having a principal surface portion and a circumferential edge portion on which a light-shielding layer is formed with a step portion formed between the principal surface portion and the circumferential edge portion are laminated through a light-transmitting resin layer formed from a liquid photocurable optical resin composition so that a light-shielding layer-formed surface of the light-transmitting cover member is arranged to face the image display member, the method comprising the steps of:

moving a resin dispenser from one end of the light-shielding layer-formed surface of the light-transmitting cover member toward the other end thereof to apply the optical resin composition to the light-shielding layer-formed surface of the light-transmitting cover member, and then pre-curing the optical resin composition by irradiating the optical resin composition with ultraviolet rays so that a curing rate of 10 to 80% is achieved to form a pre-cured resin layer having a surface of which tackiness is adjusted to 30 N/mm$^2$ or more as determined by a probe tack method;

laminating the pre-cured resin layer formed on the light-shielding layer-formed surface of the light-transmitting cover member to the image display member; and curing the pre-cured resin layer held between the image display member and the light-transmitting cover member by irradiating the pre-cured resin layer with ultraviolet rays through the light-transmitting cover member, wherein:

the resin dispenser has a discharge port having a width larger than a width of the principal surface portion of the light-transmitting cover member, for discharging the optical resin composition across both the light-shielding layer and the principal surface portion, a width between opposite end portions of the discharge port that face the light-shielding layer of the light-transmitting cover member is larger than a width of a central portion of the discharge port that faces the principal surface portion, and the resin dispenser discharges the optical resin composition from the discharge port while moving over the light-shielding layer-formed surface of the light-transmitting cover member in a lengthwise direction thereof.

11. The method of producing an image display device according to claim 10, wherein the resin dispenser adjusts a height of a front end of the discharge port from a surface of the light-transmitting cover member in consideration of an amount of irregularities generated on a circumference of the step portion in an application step previously performed.

12. The method of producing an image display device according to claim 10, wherein, when a protrusion is generated on a circumference of the step portion in an application step previously performed, the resin dispenser reduces a height of a front end of the discharge port from the light-transmitting cover member, and wherein, when a recess is generated on the circumference of the step portion in the application step previously performed, the resin dispenser increases the height of the front end of the discharge port from the light-transmitting cover member.

13. A method of producing an image display device in which an image display member and a light-transmitting cover member having a principal surface portion and a circumferential edge portion on which a light-shielding layer is formed with a step portion formed between the principal surface portion and the circumferential edge portion are laminated through a light-transmitting resin layer formed from a liquid photocurable optical resin composition so that a light-shielding layer-formed surface of the light-transmitting cover member is arranged to face the image display member, the method comprising:

moving a resin dispenser from one end of the light-shielding layer-formed surface of the light-transmitting cover member toward the other end thereof to apply the optical resin composition, of which surface tension is adjusted to be 30 mN/m or less, to the light-shielding layer-formed surface of the light-transmitting cover member, and then pre-curing the optical resin composition by irradiating the optical resin composition with ultraviolet rays so that a curing rate of 10 to 80% is achieved to form a pre-cured resin layer having a surface of which tackiness is adjusted to 30 N/mm² or more as determined by a probe tack method;

laminating the pre-cured resin layer formed on the light-shielding layer-formed surface of the light-transmitting cover member to the image display member; and curing the pre-cured resin layer held between the image display member and the light-transmitting cover member by irradiating the pre-cured resin layer with ultraviolet rays through the light-transmitting cover member, wherein the resin dispenser changes an amount of the optical resin composition applied on the light-shielding layer and on the principal surface portion of the light-shielding layer-formed surface of the light-transmitting cover member.

* * * * *